United States Patent [19]

Tomita et al.

[11] Patent Number: 5,021,660

[45] Date of Patent: Jun. 4, 1991

[54] PYROELECTRIC INFRARED DETECTOR AND DRIVING METHOD THEREFOR

[75] Inventors: Yoshihiro Tomita, Osaka; Ryoichi Takayama, Suita; Hisahito Ogawa; Koji Nomura, both of Ikoma; Junko Asayama, Suita; Atsushi Abe, Ikoma, all of Japan

[73] Assignee: Matsushita Electric Industrial Co., Ltd., Osaka, Japan

[21] Appl. No.: 431,176

[22] Filed: Nov. 3, 1989

[30] Foreign Application Priority Data

Nov. 7, 1988 [JP] Japan ............................ 63-280792

[51] Int. Cl.[5] ............................ H01L 27/146

[52] U.S. Cl. ............................ 250/338.3; 250/349; 250/350; 250/351

[58] Field of Search ............................ 250/338.3, 350, 349, 250/351

[56] References Cited

U.S. PATENT DOCUMENTS

| | | | |
|---|---|---|---|
| 3,842,276 | 10/1974 | Southgate | 250/336.1 |
| 4,072,863 | 2/1978 | Roundy | 250/332 |

FOREIGN PATENT DOCUMENTS

| | | | |
|---|---|---|---|
| 57-175930 | 10/1982 | Japan | 250/338.3 |
| 57-203926 | 12/1982 | Japan | 250/338.3 |
| 59-35118 | 2/1984 | Japan | 250/338.3 |
| 469061 | 8/1975 | U.S.S.R. | 250/338.3 |

*Primary Examiner*—Constantine Hannaher
*Attorney, Agent, or Firm*—Stevens, Davis, Miller & Mosher

[57] ABSTRACT

In a pyroelectric infrared detector, there is provided a member having a slit positioned in front of an array of pyroelectric elements, which interrupts an infrared image which is incident on the pyroelectric element array, and respective pyroelectric elements forming a row of the pyroelectric element array are wired so that they are connected in series electrically and adjacent pyroelectric element generate counter-electromotive forces. An infrared image irradiated on respective pyroelectric elements is scanned successively by the movement of the slit member along a row of the pyroelectric element array, thus obtaining information relating to an infrared intensity distribution from a heat source which emits IR rays which are being irradiated onto respective pyroelectric elements, from time series signals produced at both ends of the pyroelectric element array.

4 Claims, 3 Drawing Sheets

PYROELECTRIC INFRARED DETECTOR AND DRIVING METHOD THEREFOR

BACKGROUND OF THE INVENTION

1. Field of the Invention

The present invention relates to a device for detecting a location of an object using a pyroelectric infrared sensor.

2. Description of Related Art

A device for detecting a location of an infrared source using an infrared sensor recently has come into use for the purpose of prevention of crimes and calamities such as detection of an intruder or a fire or the like. As types of infrared sensors there are a quantum type using a compound semiconductor and a thermal type using a pyroelectric element or a thermister, etc. Since it is required for the quantum type infrared sensor to be cooled by liquid nitrogen and the like, the thermal type infrared sensor is used for the purpose of prevention of crimes and calamities and the like. In particular, the pyroelectric sensor has a higher sensitivity than other thermal-type sensors, and is therefore considered to be optimum for use as a position detector for a source of infrared radiation.

A pyroelectric sensor detects a temperature change of a sensor due to the variation of receiving quantity of infrared radiation as a voltage variation. Therefore, such a method is being employed in which infrared radiation interrupted by a rotating optical chopper and the like is irradiated to an arranged pyroelectric sensor array and in which outputs of respective sensors are compared after impedance conversion and a.c. amplification of outputs of these sensors, thereby to detect a position of a source of infrared radiation.

When the resolution of positional detection is elevated in said conventional example, the number of arranged pyroelectric elements is increased. Thus, the number of processing circuits for impedance conversion and a.c. amplification and the like for the pyroelectric elements is increased accordingly. In addition, when the number of pyroelectric elements is increased, the number of wirings between respective pyroelectric elements and processing circuits is also increased, thereby causing the distribution of wirings to become complicated. In particular, when an arrangement is made in two dimensions, the number of elements and the number of processing circuits are increased in proportion to the square of the resolution, and wiring between pyroelectric elements and processing circuits becomes difficult.

Furthermore, when picture image information is to be processed with a microprocessor and the like, it is required to read signals from respective pyroelectric elements after converting them into time series signals, and a circuit for scanning all the pyroelectric elements successively has to be added.

As described above, the device becomes large in size and the production cost thereof is also increased at the same time in a conventional example.

SUMMARY OF THE INVENTION

It is an object of the present invention to provide a pyroelectric infrared detector and a driving method therefor that solve the problems heretofore experienced as described above.

According to one aspect of the present invention, there are provided a pyroelectric element array arranged to include at least one row and a slit member having a slit for interrupting an infrared image which is incident on the pyroelectric element array, wherein respective pyroelectric elements forming one row of said pyroelectric element array are wired so that they are connected in series electrically and adjacent pyroelectric elements generate counter-electromotive forces and said slit is moved in a row direction relative to said pyroelectric element array, thereby to scan the infrared image which is being irradiated on respective pyroelectric elements in succession, thus obtaining an infrared image irradiated on respective pyroelectric elements from time series signals produced at both ends of said pyroelectric element array.

Since respective pyroelectric elements of the pyroelectric element array are connected in series and signals at both ends thereof are processed, only one circuit processing circuit is required per row, thus reducing the complexity of the wirings between the pyroelectric elements and the processing circuits and making it possible to attain high resolution and a compact size.

Also, since the pyroelectric element array is scanned optically in succession, outputs of respective pyroelectric elements may be obtained easily as time series signals, and loading into a microprocessor or the like can be easily accomplished.

A pyroelectric infrared sensor has heretofore always required an optical chopper as shown in the conventional example, whereas, according to the present invention, the slit member serves both as an optical chopper and a means for scanning the pyroelectric element array. Therefore, it is not required to add a special mechanism and the device does not become large in size even if a slit member is utilized.

DESCRIPTION OF THE PREFERRED EMBODIMENTS

Figure 1A:
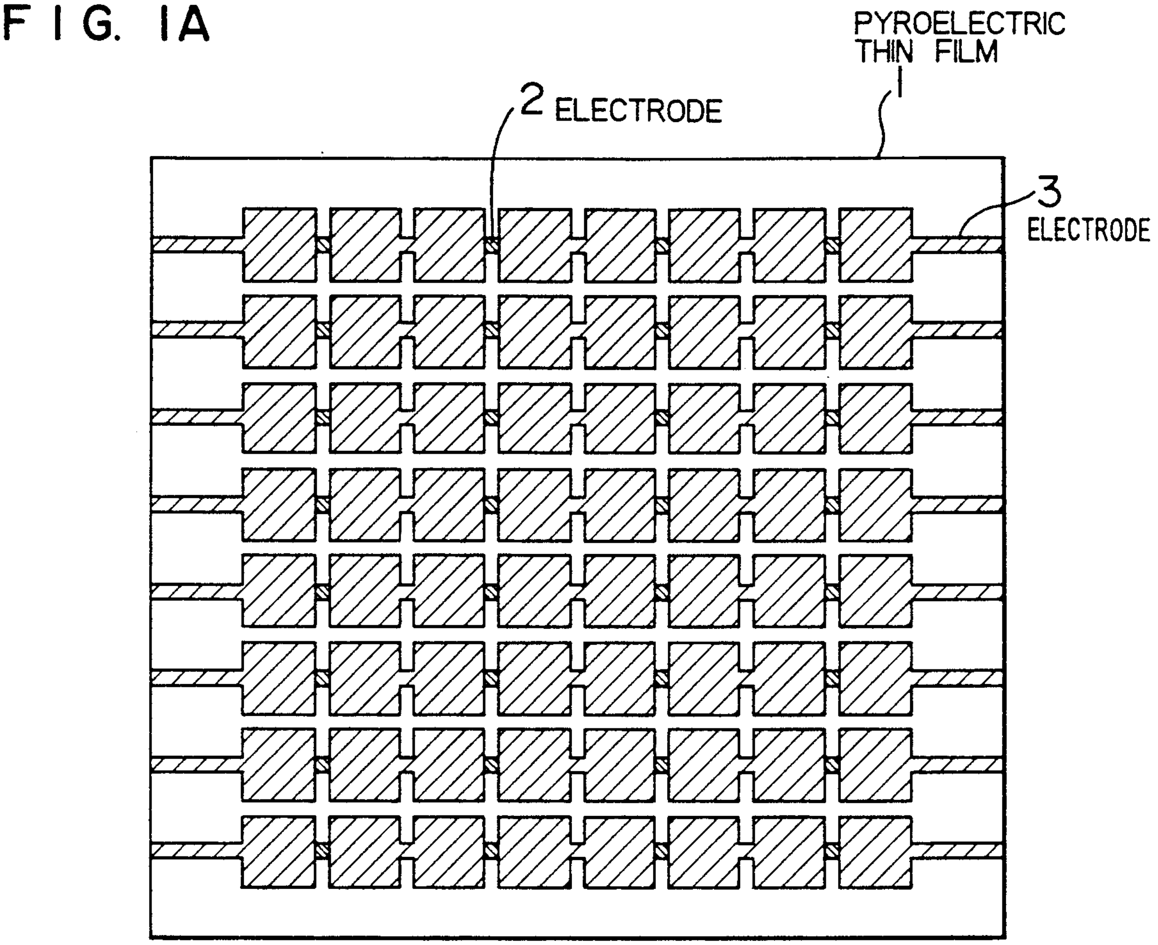
FIGS. 1A, 1B and 1C are respectively a plan view, a cross-sectional view and an equivalent circuit diagram showing an embodiment of a pyroelectric infrared detector according to the present invention.
Figure 1B:
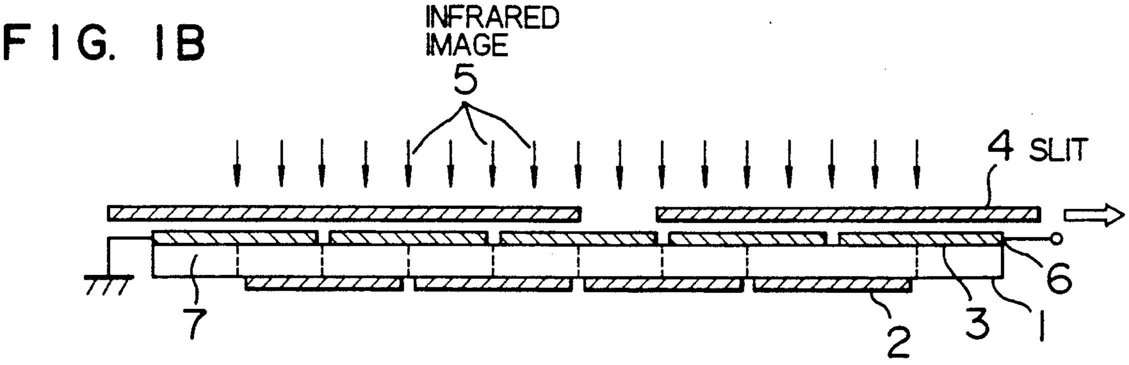
Figure 1C:
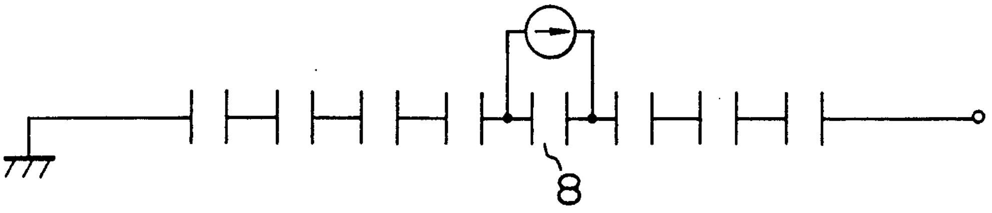

FIGS. 1A, 1B and 1C respectively show a plan view, a cross-sectional view and an equivalent circuit showing an embodiment of a pyroelectric infrared detector according to the present invention. Electrodes 2 and 3 are formed on both sides of a pyroelectric thin film 1, thus forming pyroelectric elements. Among pyroelectric elements arranged in two dimensions, adjacent elements (next element to each other) of respective pyroelectric elements in a lateral direction are connected alternately by the pattern of electrodes 2 and 3, and pyroelectric elements arranged in one row are connected in series. A plurality of rows of said pyroelectric element array are arranged in a longitudinal direction, thus forming a pyroelectric element array in two dimensions. By moving a member 4 including a slit in a horizontal direction in the front part of said pyroelectric element array, an infrared image 5 incident to the pyroelectric element array is scanned, and a voltage generated between electrodes 6 and 7 across both ends of each row is applied as an output to a signal processing circuit. When a signal of a certain pyroelectric element 8 is observed, it is comprehended that other pyroelectric elements are equivalent to those capacitors that are connected in series. Accordingly, the voltage generated at the pyroelectric element 8 becomes equal to the output signal when a signal processing circuit having a sufficiently high input impedance is connected. In other words, the output voltage is the sum of outputs of respective pyroelectric elements.

Figure 2:
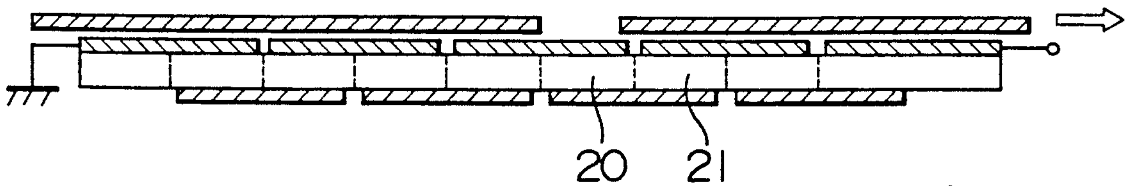
FIG. 2 and FIG. 3 are respectively a cross-sectional view and a waveform diagram showing elapsed variations typically for explaining an embodiment of the driving method of said device.
Figure 3:
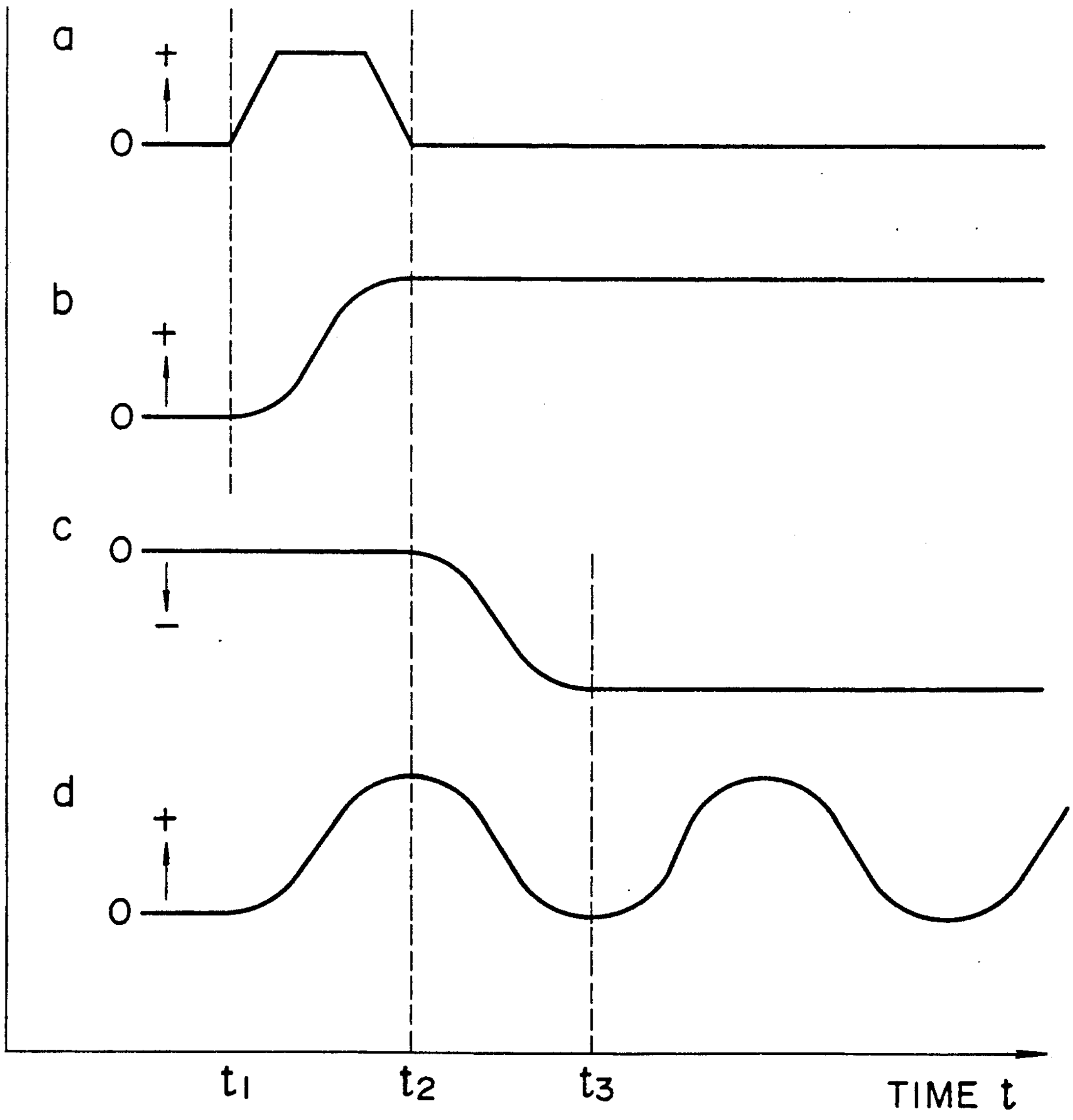

The operation of the present embodiment will be described hereunder with reference to FIGS. 2 and 3. The quantity of infrared radiation irradiated on a certain pyroelectric element 20 is varied in accordance with the movement of the slit as shown at curve a in FIG. 3. The variation of the output voltage of the pyroelectric element 20 is in proportion to the temperature change of the element, and the temperature change of the element is in proportion to the absorbed quantity of the infrared radiation. Therefore, when it is assumed that the loss of quantity of heat due to thermal diffusion and the like is sufficiently small, the output voltage is in proportion to an integral value of the quantity of irradiated infrared radiation and shows a waveform as shown at b in FIG. 3. Since an adjacent pyroelectric element 21 is connected with a polarity reverse to that of the pyroelectric element 20, the element 21 has a polarity reverse to that of the pyroelectric element 20, and is delayed in time, showing a waveform shown at c in FIG. 3. A voltage produced at an output terminal is obtained by obtaining output waveforms of other respective pyroelectric elements in a similar manner as described above and adding them up, which shows a waveform as shown at d in FIG. 3. Thus, voltages in proportion to the quantity of infrared radiation irradiated to respective pyroelectric elements are output successively in a manner such that the difference between an output at $t=t_1$ and an output at $t=t_2$ forms the output of the pyroelectric element 20 and the difference between outputs at $t=t_2$ and at $t=t_3$ forms the output of the pyroelectric element 21 among those output waveforms.

According to the present invention, all of the outputs of the pyroelectric element array in one row have been converted into time series signals and the output voltages have been made to become a.c. signals of a fixed frequency by changing the polarity of the element alternately. As a result, there are advantages as follows:

(1) Only one line of wiring between the elements and the processing circuits is required per one row.
(2) Only one processing circuit is required per one row.
(3) It is easy to improve the S/N ratio by means of a band-pass filter and the like.
(4) An optical chopper is utilized effectively as a scanning means.
(5) A scanning circuit in one direction may be omitted and it is easy to incorporate into a microprocessor and the like.
(6) Ambient temperature change, a certain amount of piezoelectric noise and so forth may be negated between adjacent elements.

In order to output signals of respective pyroelectric elements successively as in the abovementioned embodiment, the overlap with the signal of the adjacent pyroelectric element becomes large and respective signals can not be handled as independent signals individually unless the slit width is made at a cycle period of the pyroelectric element or less. However, it is possible to process the output signal waveforms by a microprocessor and so forth, and to obtain outputs of respective elements.

Figure 4:
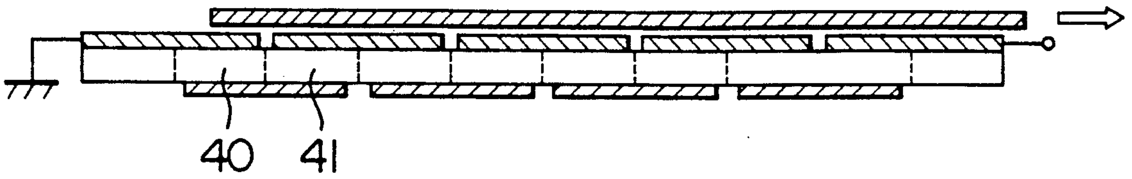
FIG. 4 and FIG. 5 are respectively a cross-sectional view and a waveform diagram showing elapsed variations typically for explaining another embodiment of the driving method of the invention.
Figure 5:
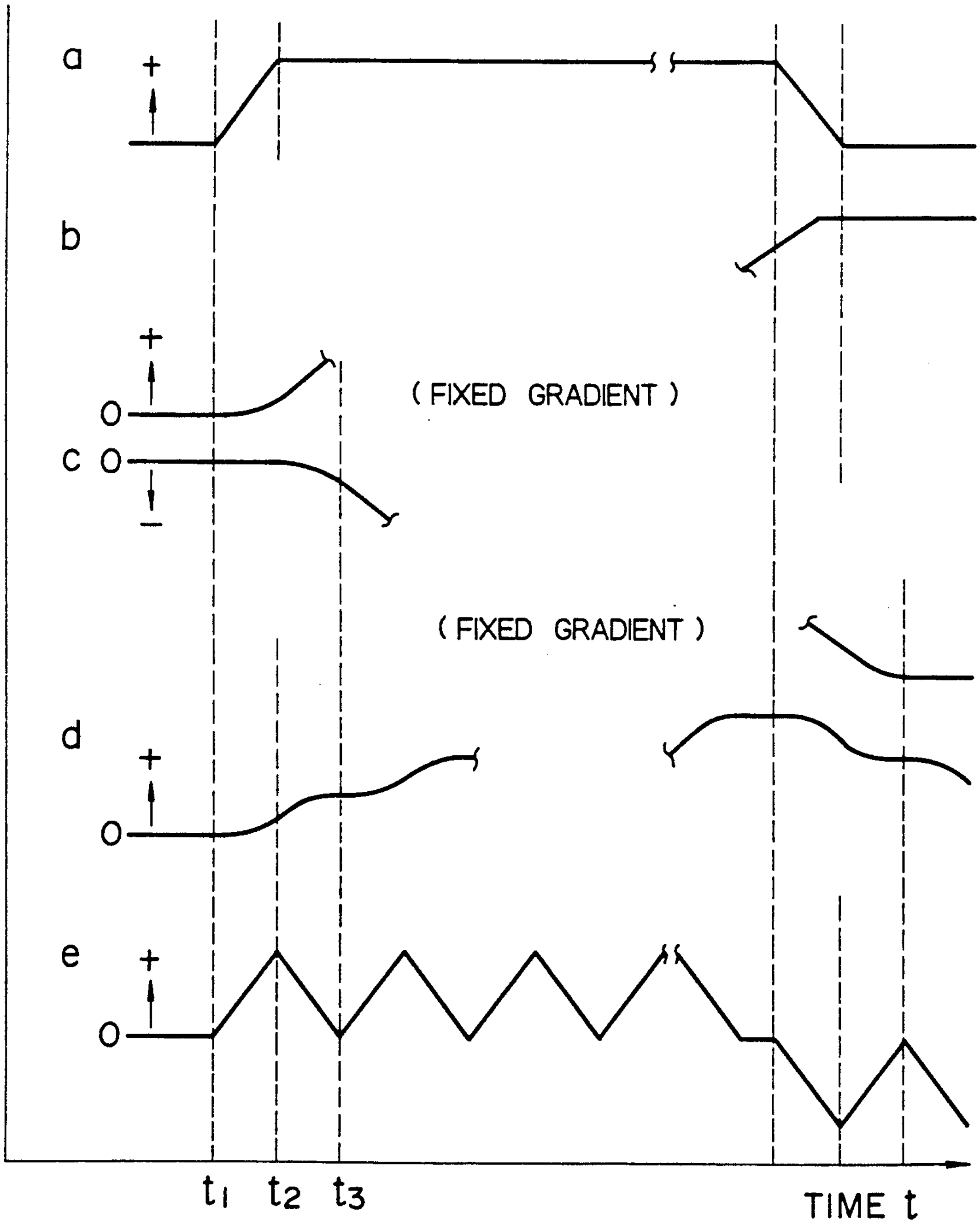

FIGS. 4 and 5 show an example of a slit member as an alternative to that of the above. This slit member has a slit which is wider than the horizontal direction of the pyroelectric element array is used, and FIG. 4 shows a condition wherein infrared radiation has started to be irradiated to a pyroelectric element 40. The elapsed variation of the quantity of infrared radiation irradiated to the pyroelectric element 40 is shown at a in FIG. 5, and the output voltage thereof is shown at b in FIG. 5. An output voltage of a next pyroelectric element 41 is shown at c in FIG. 5. A signal obtained by adding signals of all the pyroelectric elements is shown at d in FIG. 5, but a waveform as shown at e in FIG. 5 is obtained by differentiating this signal by using a differential circuit, and the difference of outputs between $t=t_1$ and $t=t_2$ becomes the signal of the pyroelectric element 40 and the difference of outputs between $t=t_2$ and $t=t_3$ becomes the signal of the pyroelectric element 41, thus making it possible to obtain output voltages of pyroelectric elements successively. Furthermore, a signal is also obtainable in a similar manner when the slit starts to cut off infrared radiation.

As described, signals of respective pyroelectric elements may be obtained by devising the shape of the slit and the processing method.

In the present invention, pyroelectric elements are connected in series. Therefore, the whole electrostatic capacity becomes smaller as the number of elements increases, and the signal voltage is lowered unless the input impedance of the signal processing circuit is made high. Since a thin film is used in the pyroelectric body in the present embodiment, the capacity of each pyroelectric element is large, which is advantageous in point of the abovementioned problems. Moreover, there is a material ($PbLaTiO_3$ group) in which polarization axes are made uniform simultaneously with film formation in the material for a pyroelectric thin film, and it is not required to apply a polarization process for making polarization of the whole pyroelectric elements uniform by using the above-mentioned material, thus facilitating manufacture.

According to the present invention, it is possible to manufacture at a low cost a pyroelectric infrared detector which has a high performance of positional resolution and in which wiring of a pyroelectric element array and processing circuits is simple, the number of processing circuits is small thus making the size compact, and processing of positional information may be performed easily with a microprocessor.

We claim:

1. A pyroelectric infrared detector comprising:

a pyroelectric element array having at least one row of pyroelectric elements and a slit member having a slit for interrupting an infrared image which is incident on said pyroelectric element array;

said pyroelectric elements forming one row of said pyroelectric element array being wired so that they are connected in series electrically and adjacent pyroelectric elements generate counter-electromotive forces; and wherein said slit member is moved in a row direction relative to said pyroelectric element array, thereby to scan the infrared image which is being irradiated on respective pyroelectric elements in succession, thus obtaining information relating to an infrared intensity distribution irradiated on respective pyroelectric elements from time sequential signals produced at both ends of said pyroelectric element array.

2. A pyroelectric infrared detector according to claim 1, wherein said pyroelectric element array is formed of a pyroelectric thin film and electrodes provided on both sides thereof, adjacent ones of said electrodes of said pyroelectric elements being connected in the same plane and one side at a time alternately, such that said pyroelectric elements are wired in series electrically.

3. A driving method for pyroelectric infrared detecting device wherein a pyroelectric element array having at least one row of pyroelectric elements and a slit member having a slit for interrupting an infrared image which is incident on said pyroelectric element array;

said pyroelectric elements forming one row of said pyroelectric element array being wired so that they are connected in series electrically and adjacent pyroelectric elements generate counter-electromotive forces; and wherein said slit member is moved in a row direction relative to said pyroelectric element array, thereby to scan the infrared image which is being irradiated on respective pyroelectric elements in succession, thus obtaining information relating to an infrared intensity distribution irradiated on respective pyroelectric elements from time sequential signals produced at both ends of said pyroelectric element array, in which the width of said slit is at the arrangement period of the pyroelectric array or less, wherein the time required for said slit to move from one pyroelectric element to a next adjacent pyroelectric element is at a period T, the output voltage of said pyroelectric element array is read at said period T in synchronization with movement of said slit, and infrared image signals of said pyroelectric element array are obtained successively with the difference from a signal which has been read one period before as a signal of a corresponding pyroelectric element.

4. A driving method for a pyroelectric infrared detector wherein a pyroelectric element array having at least one row of pyroelectric elements and a slit member having a slit for interrupting an infrared image which is incident on said pyroelectric element array;

said pyroelectric elements forming one row of said pyroelectric element array being wired so that they are connected in series electrically and adjacent pyroelectric elements generate counter-electromotive forces; and wherein said slit member is moved in a row direction relative to said pyroelectric element array, thereby to scan the infrared image which is being irradiated on respective pyroelectric elements in succession, thus obtaining information relating to an infrared intensity distribution irradiated on respective pyroelectric elements from time sequential signals produced at both ends of said pyroelectric element array, in which the width of said slit is wider than the horizontal dimension of the whole pyroelectric element array, where the time required for said slit to move from one pyroelectric element to a next adjacent pyroelectric element is at a period T, the output voltage of said pyroelectric element array is differentiated and read at said period T in synchronization with the movement of said slit, and infrared image signals of said pyroelectric array are obtained successively with the difference from a differential signal which has been read one period before as a signal of a corresponding pyroelectric element.

* * * * *